United States Patent [19]

Noufer

[11] Patent Number: 4,771,189
[45] Date of Patent: Sep. 13, 1988

[54] FET GATE CURRENT LIMITER CIRCUIT

[75] Inventor: Glenn E. Noufer, Chipita Park, Colo.

[73] Assignee: Ford Microelectronics, Inc., Colorado Springs, Colo.

[21] Appl. No.: 858,962

[22] Filed: May 2, 1986

[51] Int. Cl.⁴ .................. H03K 17/16; H03K 19/17; H03K 19/94

[52] U.S. Cl. .................. 307/448; 307/443; 307/450; 307/363; 307/581

[58] Field of Search ............ 307/443, 448, 450, 491, 307/310, 362–363, 581, 264

[56] References Cited

U.S. PATENT DOCUMENTS

| | | | |
|---|---|---|---|
| 3,774,053 | 11/1973 | Carlson | 307/443 |
| 3,975,649 | 8/1976 | Kawagoe et al. | 307/450 |
| 4,494,016 | 1/1985 | Ransom et al. | 307/443 |
| 4,590,393 | 5/1986 | Ransom et al. | 307/450 |

Primary Examiner—John S. Heyman
Assistant Examiner—M. R. Wambach
Attorney, Agent, or Firm—Antonelli, Terry & Wands

[57] ABSTRACT

A GaAs logic circuit including a current control FET that provides high current for switching an output FET, but limits the forward biasing of the output FET at the end of a transition to input logic 1 by controlling the steady state value of current to a gate of the output FET, which limits the voltage applied to the gate of the output FET to a given value. A bias circuit referenced to the voltage applied to the source of the output FET applies a nominal gate voltage to the current control FET. The value of the nominal gate voltage is such as is required to limit the value of the steady state current to the gate of the output FET to that which limits the voltage applied to such gate to the desired given value. Such nominal gate voltage is obtained by shifting the source voltage by the amount of the nominal threshold voltage $V_{Te}$ of an enhancement-mode FET of the bias circuit. If the nominal threshold voltage $V_{Te}$ varies from nominal in processing or due to operating temperature variations, the bias circuit shifts the gate voltage from nominal so that the actual voltage applied to the gate of the current control FET offsets the corresponding increase in the threshold voltage of the current control FET. As a result, the actual steady state current conducted by the GaAs logic circuit is relatively independent of such process and temperature variations.

7 Claims, 1 Drawing Sheet

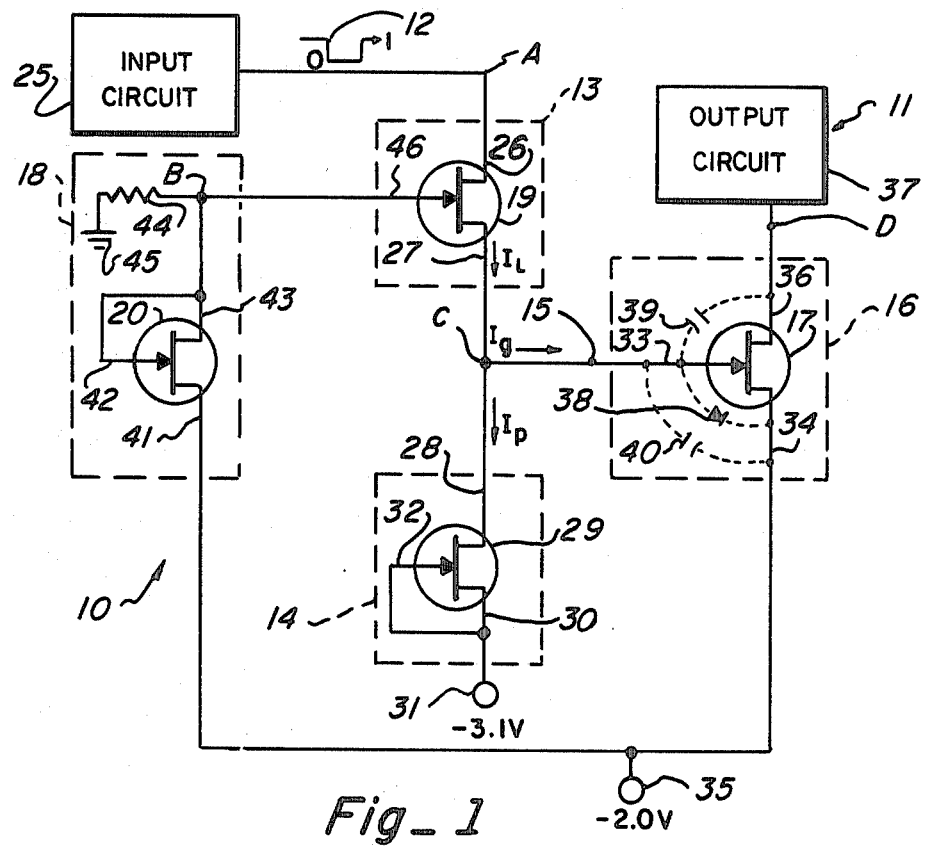
Fig_1
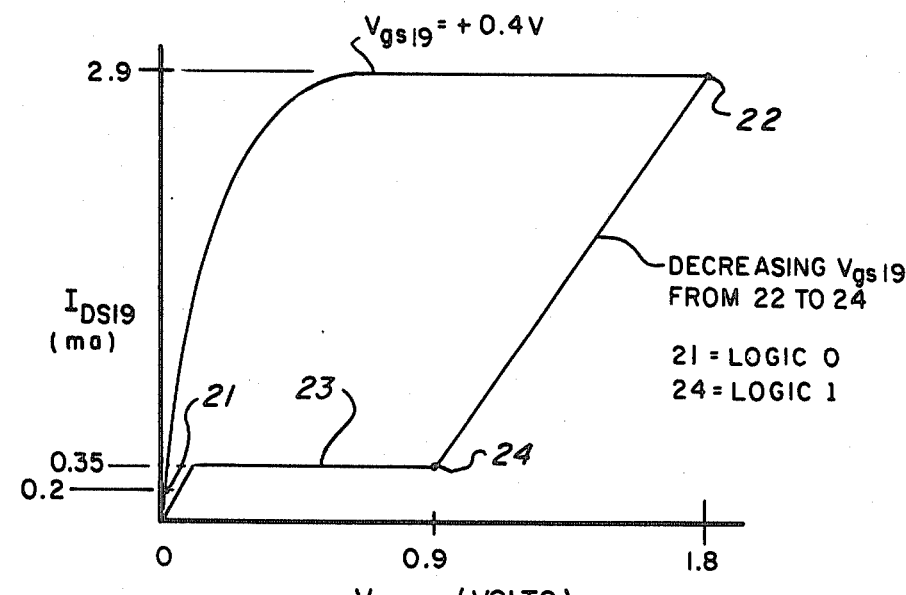
Fig_2

FET GATE CURRENT LIMITER CIRCUIT

BACKGROUND OF THE INVENTION

1. Field of the Invention

The present invention relates to the field of solid state electronics and more particularly to the field of solid state electronic logic circuits.

2. Description of the Prior Art

In designing logic circuits, attempts have been made to obtain the benefits of Gallium Arsenide (GaAs) technology while minimizing the disadvantages. In particular, GaAs provides considerably greater field effect transistor (FET) channel electron mobility than conventional semiconductors. Further, GaAs wafers exhibit very low parasitic capacitance. These factors allow fabrication of much faster transistors in GaAs than silicon.

Since GaAs depletion-mode metal-semiconductor FET (MESFET) technology has the longest manufacturing history of the GaAs technologies, the depletion-mode technology presently offers more promise for easy, cost-effective production of commercial GaAs logic circuits. In GaAs logic circuit applications, MESFET threshold voltages may range from +0.4 to −2.0 V and gate-source voltages may be as low as −3.0 V. As the gate-source supply voltage becomes more negative, power dissipation increases. As threshold voltages approach 0.0 V, less negative (lower power) gate-source supply voltages can be used, reducing power dissipation. Reduced power dissipation becomes important in designing GaAs logic gate arrays of appreciable size (e.g. larger than 80 gates). In depletion-mode GaAs FET logic gate array designs, where power dissipation may be several milliwatts per gate, the ability to use low power supply voltages is very important. However, since manufacturing tolerances become critical as threshold voltages approach 0.0 V, a common compromise for the nominal low voltage supply is −2 V. While this eases manufacturing tolerances, which are of critical concern to cost-effective commercial manufacture of logic gate arrays, the low nominal power supply voltage limits the nominal voltage swing of the output of the circuit. Although this reduced nominal output voltage swing increases the switching speed of the output of the circuit, it substantially reduces the noise margin of the next logic circuit. As a result, the reduced nominal output voltage swing increases the susceptibility of the next logic circuit to triggering in response to unwanted noise in the connecting lines.

Although depletion-mode FET manufacturing technology has the longest manufacturing history of the GaAs technologies, depletion-mode FETs made from present day GaAs technology still have relatively poor matching qualities, which increases the difficulty of designing cost-effective logic gate arrays using large numbers of gates. Device matching problems and process limitations are even greater problems in enhancement-mode FET circuit production. In particular, due to limitations in the production of both of these technologies, from device to device on a single logic gate array chip, the logic threshold voltage and output voltage may vary considerably. In a gate array, this is a substantial problem since any one input gate of a given logic circuit can be connected to an output gate of any other logic circuit. These variations in input logic threshold voltage and output voltage can decrease noise margins and interfere with the intended system operations.

Even when such depletion-mode and enhancement-mode circuits are designed to be insensitive to such variations in output voltage swing, under certain operating conditions the output voltage swing will be reduced due to forward biasing of an FET. In particular, the source resistance inherent in an output FET produces an undesired voltage drop in response to increased gate current resulting from forward biasing of the FET. This adds to the drain-to-source voltage drop across the FET, which reduces the output voltage swing when the FET is used in an inverter.

In co-pending Patent Application for FET Gate Current Limiter Circuits filed on Mar. 24, 1986, Ser. No. 843,166, in the name of David P. Laude and Glenn E. Noufer, assigned to the same assignee as the present Application, the circuits maintained a relatively large output voltage swing that provided relatively high insensitivity to unwanted noise at the logic inputs to the circuits that would otherwise have caused undesired changes in the output logic state. This large output swing was maintained under relatively adverse operating conditions in which an output FET was normally forward biased or in which it became forward biased at high temperatures, by limiting the forward biasing of the output FET in the circuit. Since the unwanted noise may be caused by capacitive coupling effects from long interconnect lines when the inputs of many of the circuits arranged in a gate array are connected in parallel, the advantages of these GaAs logic circuits were of special interest in the manufacture of large gate arrays.

Such prior FET Gate Current Limiter Circuits used the output FET to control the application of a logic signal from an input to an output. The output FET inherently had parasitic gate-to-source and gate-to-drain diodes. A control signal applied to the gate of the output FET controlled the application of the logic signal to the output through the output FET. Where such FET was an enhancement-mode GaAs device, the gate voltage could be of a value that tended to forward bias these diodes under all operating conditions and tended to significantly increase the gate current. A limiter circuit in series with the gate of the output FET was effective to limit the gate current and thus limit the forward biasing of the parasitic and circuit diodes. This reduced the effect on the gate current of variations in the power supplies to the output FET, process variations and operating temperature variations. Further, limiting the gate current limited the voltage drop resulting from the source resistance of the FET, maintaining the voltage swing of the logic signal at the output at desired levels. If the gate current were not limited, the resulting greater forward bias of those diodes would have caused an increase in the current drain from a voltage supply that biased the output FET. The unlimited forward bias would also have resulted in a greater voltage drop from drain-to-source across the output FET, reducing the voltage swing at the output and resulting in lower noise margin.

While such prior FET Gate Current Limiter Circuits provided the advantages noted above, it is also of interest to provide high speed switching of the gate voltage to the output FET that controls the application of a logic signal from the input to the output, while at steady state limiting the gate current to control the forward biasing of the gate-to-source and the gate-to-drain diodes of the output FET. Moreover, it is of interest to provide both of these advantages over a relatively wide range of process-induced and operating temperature-induced variations in the threshold voltages of the logic devices.

In the FET Gate Current Limiter Circuits of such co-pending Application, the power dissipated by the source resistance of the output FET was directly proportional to the gate current. Also, the switching speed of the gate of the output FET was dependent upon the rate of change of the gate voltage with time. Thus, the DC power requirements were for low gate current while the AC power requirements were for high gate current. Since the limiter circuit was effective to limit the gate current by using a control FET having a gate connected to its source, and the drain and source of the control FET were in series with the gate of the output FET, there was limited ability to provide the high AC current required for high speed switching and the low DC current required for minimizing power dissipation and maximizing the output voltage swing.

SUMMARY OF THE INVENTION

In contrast to the prior art that overcame the problem of heavy forward biasing of FETs but had limited switching speeds, the preferred embodiment of the present invention uses both depletion and enhancement-mode GaAs logic with an improved gate current limiter to achieve the following objectives.

A GaAs logic circuit fabricated according to the present invention maintains a relatively large output voltage swing that provides relatively high insensitivity to unwanted noise at the logic inputs to the circuit that would otherwise cause undesired changes in the output logic state. This large output swing is maintained by limiting the steady-state gate current to an output FET, while providing substantially increased gate current to the same output FET during the transition from logic 0 to logic 1. In addition, during the transition from logic 1 to logic 0, there is an increase in the gate discharge current.

Secondly, a GaAs logic circuit according to the present invention provides high speed switching from logic 0 to logic 1 of an output FET despite variations in the threshold voltages of both a depletion-mode FEt and an enhancement-mode FET used for current control in the circuit of the present invention.

Further, the variations in the threshold voltage of such enhancement-mode FET are used to offset the effect of variations in the threshold voltae of such depletion-mode FET, rendering the steady-state current to the output FET relatively insensitive to such process and operating temperature induced variations in the threshold voltage. Thus, the circuit of the present invention is relatively insensitive to such variations with the result that individual gate array yield may be significantly improved by the design of the GaAs logic circuit of the present invention.

With these objects in mind, a circuit in accordance with the present invention may be based on a GaAs logic design, in which an input circuit is responsive to an input logic signal. The input circuit includes a current control circuit provided in series with a pull-down circuit. As the input logic signal varies between logic 0 and 1, the current control circuit controls the total current $I_L$, which includes the current $I_P$ to the pull-down circuit and the current $I_g$ to a gate of an output FET of an output circuit. To limit the forward biasing of the output FET at the end of such transition to input logic 1, the steady state gate-to-source voltage ($V_{gs17}$) of the output FET is limited. With a constant source voltage $V_{s17}$ applied to the output FET, it is desired that the gate voltage $V_{g17}$ be limited to a given value.

A bias circuit is referenced to a voltage that is the same as the source voltage $V_{s17}$ that is applied to the output FET. The bias circuit applies a nominal gate voltage $V_{g19}$ to the current control circuit. The value of the nominal gate voltage $V_{g19}$ is such as is required to cause the current control circuit to limit the steady state gate voltage $V_{g17}$ of the output FET to the desired given value. Such nominal gate voltage $V_{g19}$ is obtained by shifting the reference voltage by the amount of the nominal threshold voltage $V_{T20}$ of an FET of the bias circuit.

Operating temperature variations and the process used to fabricate the circuit of the present invention make substantially equal variations from nominal in the threshold voltages $V_{T19}$ and $V_{T20}$ of both of the FETs of the bias and current control circuits. Thus, if $V_{T20}$ becomes more positive, $V_{T19}$ will also have a positive shift. In response to the nominal threshold voltage $V_{T20}$ varying from nominal by becoming more positive, for example, the bias circuit shifts the reference voltage so that the actual gate voltage $V_{g19}$ becomes more positive. When the gate voltage $V_{g19}$ applied to the current control FET becomes more positive it will offset the positive shift in the threshold voltage $V_{T19}$ of the current control FET. As a result, the actual steady state current $I_L$ conducted by the current control circuit is relatively independent of such process and temperature variations. Since the actual steady state current $I_L$ regulates the actual steady state gate voltage $V_{g17}$ of the output FET, by rendering the steady state current $I_L$ relatively process and temperature independent the actual gate voltage $V_{g17}$ is held at the nominal or given desired value.

The current control circuit provides such steady state gate voltage $V_{g17}$ by limiting the total steady state current $I_L$, including the current $I_g$ to the gate of the output FET and the current $I_P$ to the pull-down circuit at steady state in logic 1. However, the current control FET is not effective to limit such current $I_L$ in the initial portion of the transition from logic 0 to logic 1 because it is sized large enough to supply both the current required by the pull-down circuit and the high current necessary to switch the output circuit at high speed during this logic transition. Thus, as the potential $V_I$ of the input logic signal rises to logic 1, and with the bias circuit applying a process and temperature insensitive voltage $V_{g19}$ to the FET of the current control circuit, the current control circuit conducts substantially more current to the gate of the output FET until the value of the term $(V_{gs19} - V_{T19})^2$ becomes effective to limit the current $I_L$ to that required by the pull-down circuit plus the reduced amount of steady state current $I_{gs19}$ necessary to provide the given desired value of the gate voltage $V_{g17}$ that limits the forward biasing of the FET of the output circuit.

BRIEF DESCRIPTION OF THE DRAWINGS

Other objects, features and advantages of the present invention will be apparent from an examination of the following detailed descriptions which include the attached drawings in which:

FIG. 1 is a schematic diagram of a GaAs, logic circuit illustrating the preferred embodiment of the present invention.

FIG. 2 is a graph illustrating the relationship between the drain-to-source current ($I_{DS}$) of a current control FET and the drain-to-source potential ($V_{DS}$) of such FET, where the AC $I_{DS}$ is substantially increased to provide the necessary current to an output circuit for high speed switching.

DESCRIPTION OF THE PREFERRED EMBODIMENT

The preferred embodiment of the present invention is illustrated in FIG. 1 as an input circuit 10 implemented in both depletion-mode and enhancement-mode GaAs medium. The input circuit 10 controls an output circuit 11 that may be implemented in an enhancement-mode GaAs medium.

As used herein, the input circuit 10 responds to an input logic signal 12 that varies between logic 0 and 1. In response to this input logic, the output circuit 11 provides output logic that is the opposite of the input logic. Thus for an output logic 0, the output is a logic 1 and for an input logic 1, the output logic is 0. In the preferred embodiment of the present invention the nominal voltage used herein that corresponds to the input logic 0 is −2.1 V and to the input logic 1 is −0.4 V. The nominal voltage used herein corresponding to the output logic 0 is −1.9 V and to the output logic 1 is 0.0 V. These are referred to as $V_{IL}$, $V_{IH}$, $V_{OL}$, and $V_{OH}$, respectively.

The term "voltage swing" or "logic swing" is used herein to identify the difference in the nominal or actual output voltage levels $V_{OH}$ and $V_{OL}$ coresponding to logic 1 and logic 0. A wide difference between the nominal $V_{OH}$ and $V_{OL}$ is desirable to render the various gates of a gate array insensitive to process and operational variables that may combine to narrow the actual difference in operation.

These voltages are referenced to "ground" or "ground potential," which is a fixed reference potential. Thus, the 0.0 V potential is at ground potential whereas a low (−0.5 V) potential is nearer ground potential (more positive) than a higher (−1.8 V) potential. The nominal input and output logic voltage levels and the potentials of voltage supplies described herein have been selected for compatibility with voltage supplies used with ECL circuits. All of these voltages could be shifted by fixed amounts, or the circuits could be implemented using positive voltage supplies, but the circuit fundamentals of the present invention would still apply.

The term "threshold voltage" used herein with respect to an FET indicates the externally applied gate-to-source voltage which just pinches off the conducting channel and is referred to as "$V_T$". A nominal $V_T$ is that $V_T$ that should be attained in the fabrication of the FET, but the actual $V_T$ attained or existing in circuit operation may vary depending on process, operating temperature and other variables.

In regard to a FET used in a current control circuit 13, for example, of the preferred embodiment of the present invention, if such FET is conducting (or ON) in response to an input logic signal of logic 1, as the input voltage falls to logic 0, the source voltage $V_s$ applied to that FET drops to less than $V_T$ to render such FET non-conducting (or OFF).

The term "insensitivity" is used herein to denote a characteristic of the circuit of the preferred embodiment of the present invention that it will operate to provide the desired high current level during the logic 0 to logic 1 transition and the subsequent steady state $I_L$ to provide the nominal steady state gate voltage $V_{g17}$ even though the actual threshold voltages $V_T$ of the FETs of the circuit may vary relatively widely from nominal.

The term "noise margin" as used herein refers to the voltage difference, measured on the input voltage axis (abscissa) of a standard transfer characteristic (of a GaAs logic circuit of the preferred embodiment of the present invention, for example,) between the input operating point (either $V_{IH}$ or $V_{IL}$) and the nearest unit gain point, i.e., where the slope $\Delta V_O/\Delta V_I = -1$. In the GaAs logic circuit of the preferred embodiment of the present invention, the noise margin is relatively high since the current control circuit of the present invention keeps the output voltage swing close enough to its nominal value to maintain the desired logic operation of the circuits.

A circuit in accordance with the present invention may be based on a GaAs logic design, in which the input circuit 10 is responsive to the input logic signal 12. The input circuit 10 includes the control circuit 13 provided in series with a pull-down circuit 14. The current control circuit 13 controls the total current $I_L$ conducted by the circuit 13, which is the drain-to-source current $I_{DS}$. The current $I_L$ includes the current $I_P$ to the pull-down circuit 14 and the current $I_g$ to an input 15 of a circuit 16 of the output circuit 11.

At the end of a transition from input logic 0 to input logic 1, to limit the forward biasing of an output FET 17, the steady state gate-to-source potential ($V_{gs17}$) of the output FET 17 is limited. With a constant source voltage $V_{s17}$ applied to the output FET 17, the gate voltage $V_{g17}$ must thus be limited to a given nominal or desired value.

A bias circuit 18 referenced to the source voltage $V_{s17}$ that is applied to the output FET 17 applies nominal gate voltage $V_{g19}$ to a FET 19 the current control circuit 13. The value of the nominal gate voltage $V_{g19}$ is such as is required to limit the gate voltage $V_{g17}$ of the output FET 17 to the nominal given value. Such nominal gate voltage $V_{g19}$ is obtained by shifting the source voltage $V_{s17}$ by the amount of the nominal threshold voltage $V_{T20}$ of a FET 20 of the bias circuit 18. If in processing, or due to operating temperature variations, the nominal threshold voltage $V_{T20}$ varies from nominal by becoming more positive, for example, the bias circuit 18 level shifts the reference voltage $V_{s17}$ so that $V_{g19}$ becomes more positive. Since operating temperature variations and the process used to fabricate the circuit of the present invention make substantially equal variations from nominal in the threshold voltages $V_{T20}$ and $T_{T19}$ of both of the FETs of the respective bias and current control circuits 18 and 13, when the gate voltage $V_{g19}$ becomes more positive it will offset the positive shift in the threshold voltage $V_{T19}$ of the current control FET 19. As a result, the actual steady-state control $I_L$ conducted by the current control circuit is relatively independent of such process and temperature variations. Since the actual $I_L$ regulates the actual steady-state gate voltage $V_{g17}$ of the output FET 17, by rendering $I_L$ relatively process and temperature independent, the actual gate voltage $V_{g17}$ is held at a value that is substantially the same as the nominal value.

The current control circuit 13 provides such steady state gate voltage $V_{g17}$ by limiting the total current $I_L$, including the current $I_g$ to the input 15 of the output circuit 11 and the current $I_P$ to the pull-down circuit 14 at steady state in logic 1. However, the current control circuit 13 is not effective to limit such current $I_L$ in the initial portion of the transition from logic 0 to logic 1 because the FET 19 is sized large enough to supply the current required by the pull-down circuit 14 and the high current $I_g$ necessary to switch the output circuit 11 at high speed during this logic transition. Thus, as the potential $V_I$ of the input logic signal 12 rises to logic 1, and with the bias circuit 18 applying the voltage $V_{g19}$ to the FET 19 of the current control circuit 13, the current $I_L$ through the current control circuit 13 is not limited to the steady state level. Since the pull-down circuit 14 draws constant current $I_P$, the increase in the current $I_L$ is supplied as $I_g$ to the input 15 to the output circuit 11 for high speed switching. The substantially increased current $I_L$ starts to decrease as $V_{s19}$ rises under the action of $I_L$. Since $I_L$ is proportional to $(V_{gs19} - V_{T19})^2$, (and with $V_{g19}$ and $V_{T19}$ constant), $I_L$ will not decrease as fast as $V_{s19}$ rises. With $I_L$ falling slower than $V_{s19}$ rises, $I_g$ remains increased longer for high speed switching of the output circuit 11.

$V_{s19}$ continues to rise under the action of $I_L$. With $V_{g19}$ constant under the control of the bias circuit 18, the value of $(V_{gs19} - V_{T19})^2$ becomes effective to limit the current $I_L$ to that required by the pull-down circuit 14 plus the reduced amount of steady state current $I_{g17}$ necessary to provide the nominal value of $V_{g17}$ that limits the forward biasing of the FET 17 of the output circuit 11.

Referring now to FIG. 2, the drain-to-source current $I_L$ through the FET 19 of the current control circuit 13 is shown as $I_{DS19}$ and the drain-to-source voltage across the FET 19 is shown as $V_{DS19}$. Based on simulation of the steady state operation of the circuit 11 at logic 0, the current $I_{DS19}$ (or $I_L$) through the FET 19 is 0.2 mA. As the input logic signal 12 switches from logic 0 to logic 1, the current $I_{DS19}$ rapidly increases to 2.9 mA. As $V_{DS19}$ increases from that shown at point 21 to that at point 22, $V_{gs19}$ is +0.4 V. This value of $I_{DS19}$ is substantially greater than the value of 0.2 mA at steady state at logic 0 shown at point 21. As $V_{gs19}$ decreases, the current $I_{DS19}$ drops slower than the rate of change of $V_{gs19}$ and falls to the steady state level shown at the point 24, which is the low level desired at steady state in logic 1 to provide the selected nominal value of $V_{g17}$ required to limit the forward biasing of the FET 17 so as to minimize power dissipation and minimize the reduction of the output voltage swing.

Referring now in greater detail to FIGS. 1 and 2, a node A is shown formed between the input circuit 10 and a circuit 25 that may be in the form of a parallel array of input diodes (not shown) to provide the input logic signal 12 to the node A in a well known manner. The input logic circuit 10 includes the current control circuit 13 provided with the depletion-mode FET 19. A drain 26 of the FET 19 is connected to the node A whereas a source 27 is connected to a node C. The node C is connected to a drain 28 of a FET 29 of the pull-down circuit 14. A source 30 of the pull-down circuit 14 is connected to a voltage supply 31 for providing a bias potential of −3.1 V, for example, to the pull-down circuit 14. A gate 32 of the pull-down circuit 14 is connected to the source 30 to render the FET 29 ON so as to constantly bias the node C. The FET 29 is a depletion-mode GaAs device in the preferred embodiment of the circuit 10.

The node C is also connected to the input 15 of the circuit 16. The circuit 16 may be an inverter and includes the FET 17 having a gate 33 connected to the input 15. A source 34 is connected to a −2.0 V power supply 35 such that the source voltage $V_{s17}$ is −2.0 V. The FET 17 is also provided with a drain 36 that is connected to an output node D that is also connected to a circuit 37, such as a pull-up circuit, for providing desired bias to the output node D in a well known manner. The circuit 16 and the pull-up circuit 37 form the output circuit 11. When the FET 17 is OFF, the circuit 37 may function to apply ground potential to the node D, which would be $V_{OH}$ and output logic 1. On the other hand, when the FET 17 is ON or conducting, a low potential such as −1.9 V would appear at the node D representing $V_{OL}$.

The FET 17 may be an enhancement-mode device implemented in GaAs medium and is typical devices used in output circuits such as the output circuit 11. More particularly, the FET 17 has a gate-to-source diode 38 (shown in dashed lines) that can become forward biased. The FET 17 also has source resistance to the gate current $I_{g17}$ that flows through the gate 33. Any gate current $I_{g17}$ which results in a $V_{gs17}$ greater than 0.7 V results in greater than necessary power dissipation as well as increased voltage drop $V_{DS}$ across the FET 17. Such increased voltage drop will result in a smaller output voltage swing $V_{OH} - V_{OL}$ and a decrease in the noise margin. It should be understood that the FET 17 also exhibits Miller multiplication of the gate-to-drain capacitance 39 (shown in dashed lines) and has gate-to-source capacitance 40 (shown in dashed lines). As a result, the current $I_{g17}$ to the gate 33 of the FET 17 should be substantial to rapidly switch the logic appearing at the output node D.

The circuit 10 of the present invention provides such increased gate current $I_{g17}$ during the logic transition from logic 0 to 1 yet low gate current $I_{g17}$ following such logic transition. This variable gate current $I_{g17}$ is provided under the control of the current control circuit 13 in conjunction with the bias circuit 18. In particular, the bias circuit 18 includes the FET 20 having a source 41 connected to the power supply 35. A gate 42 of the FET 20 is connected to a drain 43 of the FET 20, and both are connected to a node B which is in turn connected to a resistor 44 connected to ground 45. The resistor 44 has a nominal value of 100K Ohms which is selected to provide a minimum current from ground 45 through the FET 20 to the power supply 35 such that there is a voltage drop of 0.2 V across the FET 20. As a result, a nominal potential $V_B$ of −1.8 V appears at node B. The −1.8 V potential $V_B$ is applied to a gate 46 of the FET 19 of the current control circuit 13 as the nominal gate voltage $V_{g19}$. The nominal −1.8 V potential $V_{g19}$ applied to the gate 46 is selected with reference to the potential $V_{s17}$ applied to the source 34 of the FET 17. The FET 20 is effective to shift the −2.0 V potential up to the nominal voltage $V_{g19}$ of −1.8 V, which 0.2 V shift is the amount of the nominal threshold voltage $V_{T20}$ of the FET 20.

As described in more detail below, the voltage shift by the nominal value of $V_{T20}$ was selected so that at steady state in logic 1, the gate-to-source potential $V_{gs17}$ of the FET 17 is nominally at the selected maximum value of +0.7 V to just render the FET 17 conductive for maximum $I_{DS}$ without any excess $I_{gs}$. Thus, the nominal gate voltage $V_{g19}$ applied to the gate 46 of the FET 19 is referenced to the nominal value of $V_{T20}$ for minimizing power dissipation at steady state in logic 1 and maximizing the voltage swing appearing at the output node D, which results from minimizing the voltage drop $V_{DS}$ across the FET 17.

In the preferred embodiment of the present invention the FET 20 is an enhancement-mode device whereas the FET 19 is a depletion-mode device, both implemented in GaAs medium. The values of the respective nominal threshold voltages $V_{T20}$ and $V_{T19}$ of these FETs 20 and 19 are such that when $V_{s17}$ of $-2.0$ V is shifted by the nominal $V_{T20}$ of $+0.2$ V, the resulting nominal gate voltage $V_{g19}$ results in a selected value of the term $(V_{gs19}-V_{T19})^2$. The current $I_P$ drawn by the pull-down FET 29 is constant such that the current $I_g$ to the gate 33 of the output FET 17 is also proportional to $(V_{gs19}-V_{T19})^2$. It may be understood then that the value selected for $(V_{gs19}-V_{T19})^2$ is such that at steady-state in logic level 1, the $I_L$ resulting from this selected value provides $I_{g17}$ of the that value required to provide $V_{g17}$ with the nominal given value of $+0.7$ V.

As indicated above, the circuit 10 of the present invention is relatively insensitive to variations from nominal in $V_{T19}$ and $V_{T20}$ caused by processing and operating temperature. This is achieved by maintaining the value of $(V_{gs19}-V_{T19})^2$ at the selected value even though $V_{T19}$ and $V_{T20}$ vary. This selected value is maintained by using to advantage the fact that operating temperature variations and the process used to fabricate the circuit of the present invention make substantially equal variations from nominal in the threshold voltages $V_{T20}$ and $V_{T19}$ of both of the FETs of the respective bias and current control circuits 18 and 13. For example, $V_{T19}$ varies over the range $-0.6$ to $-1.0$ V, with the nominal $V_{T19}$ being $-0.8$ V. $V_{T20}$ varies from $0.0$ V to $+0.4$ V, with the nominal $V_{T20}$ being $+0.2$ V. Thus, there is a $+1.0$ V difference (with a relatively minor $\pm 0.1$ V tolerance) between $V_{T19}$ and $V_{T20}$ even as they vary from nominal over process or as operating temperature varies. Without any adjustment of $V_{gs19}$, if $V_{T19}$ becomes more positive, the term $(V_{gs19}-V_{T19})^2$ will decrease rather than be constant. However, when $V_{T19}$ becomes more positive $V_{T20}$ will also become more positive. When $V_{T20}$ becomes more positive, there is a resulting increase in the amount by which the $-2.0$ potential $V_{s41}$ is level shifted, such that $V_{g19}$ becomes more positive. The amount by which $V_{g19}$ becomes more positive is sufficient to offset the more positive shift in the threshold voltage $V_{T19}$ of the current control FET 19. As a result, the term $(V_{gs19}-V_{T19})^2$ remains relatively constant. Since the actual steady state current $I_L$ conducted by the current control circuit 10 is proportional to $(V_{gs19}-V_{T19})^2$ and since $I_P$ to the pull-down circuit 14 is constant, the resulting $I_{g17}$ supplied to the gate 33 of the output FET 17 remains relatively constant at steady state in logic 1, relatively independent of such process and temperature variations. since the actual $I_{g17}$ regulates the actual steady state gate voltage $V_{g17}$ of the output FET 17, by rendering $I_L$ relatively process and temperature independent the actual gate voltage $V_{g17}$ is held at substantially the nominal value.

The current control circuit 13 provides such process and temperature independent, steady state $V_{g17}$ by limiting the total current $I_L$, including the current $I_g$ to the input 15 of the output circuit 11 and the current $I_P$ to the pull-down circuit 14, at steady state in logic 1. However, the current control circuit 13 is not effective to limit such current $I_L$ in the initial portion of the transition from logic 0 to logic 1 because the current control FET 19 is sized large enough to supply the pull-down circuit 14 and to supply the high current $I_g$ necessarsy to switch the output circuit 11 at high speed during this logic transition. In particular, the area of the FET 19 relative to that of the FETs 17, 2∅ and 29 is 0.56, 5.0 and 6.7 respectively.

Referring now to FIGS. 1 and 2 in conjunction with Table 1, it may be understood that at logic 1 in steady state, the $V_{DS19}$ across the FET 19 of the current control circuit 13 is represented at point 24 of FIG. 2. The resulting steady state current $I_{DS}$ is shown at a relatively low level of 0.35 mA. This is sufficient to supply the pull-down circuit 14 and that steady state current $I_g$ that provides the selected nominal value of $V_{g17}$. With this $I_{DS}$ the pull-down circuit 14 pulls the potential at the node C, and thus $V_{g17}$ and $V_{s19}$, down to a $-1.3$ V potential. As a result, the FET 17 is ON and a $-1.9$ V potential appears at the node D representing $V_{OL}$.

TABLE 1

| Time | $V_A$ IN | Logic IN | $V_B$ | $V_C$ | State FET 19 | $V_{gs}$ FET 19 | $V_{DS}$ FET 19 | $I_{DS}$ FET 19 | $V_{gs}$ FET 17 | $V_s$ FET 17 | $V_{DS}$ FET 17 | State FET 17 | Logic OUT | $V_D$ OUT |
|---|---|---|---|---|---|---|---|---|---|---|---|---|---|---|
| Steady State | −0.4 | 1 | −1.8 | −1.3 | ON to LIMIT | −0.5 | +0.9 | 0.35 | +0.7 | −2 | 0 | ON | 0 | −1.9 |
| $t_{0+}$ | −1.3 | to 0 | −1.8 | −1.3 | OFF | to +0.4 | 0 | 0 | to −0.2 | −2 | to 2.0 | OFF | to 1 | to 0 |
| $t_{0++}$ | to −2.1 | to 0 | −1.8 | to −2.2 | to ON | +0.4 | +0.1 | to 0.2 | −0.2 | −2 | ≈2.0 | OFF | 1 | 0 |
| Steady State | −2.1 | 0 | −1.8 | −2.2 | ON LOW | +0.4 | +0.1 | 0.2 | −0.2 | −2 | 2.0 | OFF | 1 | 0 |
| $t_{1+}$ | −0.4 | to 1 | −1.8 | −2.2 | ON HIGH | +0.4 | to +1.8 | 2.9 | to +0.7 | −2 | ≈0 | ON | to 0 | to −1.9 |
| $t_{1++}$ | −0.4 | 1 | −1.8 | to −1.3 | Drops to LIMIT Value | to −0.5 | to +0.9 | to 0.35 | +0.7 | −2 | 0 | ON | 0 | −1.9 |
| Steady State | −0.4 | 1 | −1.8 | −1.3 | ON to LIMIT | −0.5 | +0.9 | 0.35 | +0.7 | −2 | 0 | ON | 0 | −1.9 |

As the input logic signal 12 enters a first part of a logic transition from logic 1 to logic 0 at time $t_{0+}$, the potential at node A drops rapidly from $-0.4$ V to $-1.3$ V. As indicated in FIG. 2, the potential $V_{DS19}$ across the FET 19 drops rapidly from about 0.9 V to 0.0 V. Thus, as input logic signal 12 drops to $-1.3$ V at time $t_{0+}$, the voltage at node C stays at $-1.3$ V instantaneously. As a result, $V_{DS19}$ of the FET 19 is 0.0 V and the FET 19 is rendered non-conductive.

Going to time $t_{0++}$, the pull-down circuit 14 is effective to further pull node C down to $-2.2$ V, with $V_{gs19}$ of FET 19 becoming $+0.4$ V at time $t_{0++}$ to render the FET 19 ON to supply the $I_P$ required by the pull-down circuit 14. Thus with the input logic signal 12 in logic level 0 at $-2.1$ V, $V_{g17}$ (or $V_C$) applied to the gate 33 of the FET 17 is $-2.2$ V, which renders the FET 17 OFF. As a result, the potential at node D rises under control of the pull-up circuit 37 to provide $V_{OH}$ at the node D.

With the potential $V_C$ at the node C pulled-down to $-2.2$ V, $V_{s19}$ of the FET 19 is $-2.2$ V which turns FET 19 slightly ON enough to provide $I_{DS19}$ (or $I_L$) of the FET 19 at the relatively low 0.2 mA value at logic 0 in steady state as indicated in FIG. 2.

As the input logic signal 12 then switches to input logic 1, the $-2.1$ V potential at node A rapidly rises to $-0.4$ V. The bias circuit 18 holds the potential $V_B$ at the gate 46 of the FET 19 constant at $-1.8$ V ($V_{g19}$). As shown in Table 1, the potential $V_C$ is momentarily held at $-2.2$ V. In this condition, with the gate area of the FET 19 large, the FET 19 does not function as a current limiter in that the FET 19 conducts substantially more current than that indicated at line 23 in FIG. 2. In particular, based on simulations of the operation of the circuit 11, during this transition to logic 1 the $I_{DS19}$ conducted by FET 19 increases approximately ten-fold to the 2.9 mA value indicated at point 22 in FIG. 2.

As the potential at node A rises to $-0.4$ V at time $t_{1+}$, the potential at the node C is pulled up through the FET 19 from its original $-2.2$ V level. As the potential $V_C$ at node C rises, $V_{gs19}$ becomes smaller since the FET 20 is effective to hold $V_B$, hence $V_{g19}$, at the constant $-1.8$ V value. Since $V_{T19}$ is constant at constant operating temperature, and since $I_L$ ($I_{DS19}$ in FIG. 2) is proportional to $(V_{gs19}-V_{T19})^2$, $I_{DS19}$ shown in FIG. 2 decreases as $V_{gs19}$ decreases from point 22 toward point 24.

As this occurs, the gate-to-source potential $V_{gs17}$ of the FET 17 rises from its original $-0.2$ V value to render the FET 17 conductive. However, as the potential at node A continues to rise to $-0.4$ V at time $t_{1++}$, the combined effect of the constant gate voltage $V_{g19}$ applied to the gate 46 of the FET 19 and the rising potential at node C reduces $V_{gs19}$ further. When $(V_{gs19}-V_{T19})^2$ reaches the selected value, the FET 19 becomes substantially less conductive as indicated at the point 24 in FIG. 2. Such rapid decrease in the current $I_{DS19}$ through the FET 19 occurs after the capacitances 39 and 40 of the FET 17 have been charged. The decreased current $I_{DS19}$ results in substantially decreased gate current $I_{g17}$ to the gate 33 of the FET 17, such that $V_{g17}$ is limited to the desired value of $-1.3$ V that limits the forward biasing of the FET 17 to just that amount at which $I_{DS17}$ is maximum. With $I_{g17}$ limited, the gate-to-source current $I_{gs17}$ of the FET 19 is limited, which is effective to limit the power dissipated. Further, the desired voltage drop between the power supply 35 and node D is limited to the maximum desired value of $-1.9$ V. As a result, the voltage swing $V_{OH}-V_{OL}$ at the node D remains relatively wide.

It may be appreciated that at time $t_{1++}$, which represents the end of the transition from input logic 0 to input logic 1, the potential at node A has risen to $-0.4$ V, the gate potential $V_{g19}$ at the gate 46 is still at its constant $-1.8$ V value, and the current $I_L$ (shown as $I_{DS19}$ in FIG. 2) conducted by the FET 19 has been regulated by the combined effects of the bias circuit 18 and the pull-down circuit 14 to provide sufficient current $I_P$ for the pull-down circuit 14 and only such additional current $I_{g17}$ as is necessary to provide the selected gate potential $V_{g17}$ of $-1.3$ V at the gate 33. This regulation allows the current $I_{DS19}$ through the FET 19 to rapidly increase (represented by increasing $I_{DS19}$ from point 21 to 22 in FIG. 2) and provide increased current $I_{g17}$ to the gate 33 rendering it possible to rapidly charge the capacitances 39 and 40 to switch the logic appearing at node D at high speed. At the end of this first part of the logic transition (represented by point 22 on FIG. 2) the current $I_{DS19}$ through the FET 19 rapidly drops and limits the potential $V_{g17}$ at the gate 33 to the $-1.3$ V value that renders the FET 17 conductive at the limited desired value.

Different circuits designed in accordance with the principles of the present invention may provide different values for the power supply 35. Depending upon the selection of the particular devices that correspond to the FETs 17, 19 and 20 of the present invention, different values of $V_{g19}$ applied to the gate 46 of the FET 19 and $V_{g17}$ applied to the gate 33 of the FET 17 may be selected. The following considerations that were used in the design of the circuit 10 of the present invention may result in different values of such potentials without departing from the teachings of the present invention.

It is to be understood that both FETs 17 and 20 are biased to $-2.0$ V by the power supply 35. Further, the threshold voltages $V_{T19}$ and $V_{T20}$ vary from nominal by about the same amount during processing or with changes in the operating temperature. Also, the current $I_P$ to the pull-down circuit 14 is constant at 0.2 mA. Finally, the desired $+0.7$ V value of $V_{gs17}$ to limit the forward biasing of the FET 17 results in the selected $-1.3$ V ($V_{g17}$) value for the potential applied to the gate 33 of the FET 17. Applying these considerations to the current at the node C, the current $I_{DS19}$ through the FET 19 is equal to the constant $I_P$ of 0.2 mA drawn by the pull-down circuit 14 plus $I_{g17}$ of 0.15 mA to the gate 33 of the FET 17. Such current $I_L$ can be represented in terms of the width $W_{19}$ of the FET 19, Beta and the square of the difference between $V_{gs19}$ and $V_{T19}$ of the FET 19. Having selected $W_{19}$ to render the FET 19 effective to conduct high $I_{DS19}$ for high speed switching, with Beta known and $I_P$ known to be 0.2 mA, the current $I_L$ can be represented by:

$$I_L \propto (V_{gs19}-V_{T19})^2, \text{ or}$$

$$I_L \propto (V_{g19}-V_{s19}-V_{T19})^2.$$

An objective of the present invention is to have $(V_{g19}-V_{s19}-V_{T19})$ be relatively constant over process and temperature variations, but $I_L$ must be limited to a constant value that results in $I_{g17}$ that provides the desired $V_{gs17}$ of $+0.7$ V. Since in the preferred embodiment the nominal threshold voltages $V_{T19}$ and $V_{T20}$ of the FETs 19 and 20 are different by a given amount and vary uniformly with process variations, the difference between $V_{T19}$ and $V_{T20}$ can be expressed as:

$$V_{T20}-V_{T19}=1.0 \text{ V}.$$

As a result, at steady state, with $V_{g19}$ expressed as $V_B$, $V_C$ being the desired $-1.3$ V and the term $V_{T20}-V_{T19}=$ the constant 1.0 V, the term $(V_{g19}-V_{s19}-V_{T19})$ can be expressed as:

$$(V_{T20}-V_{T19}-0.7 \text{ V}),$$

which can be reduced to:

$$1.0 \text{ V} - 0.7 \text{ V} = 0.3 \text{ V}$$

since:

$$V_{T20} - V_{T19} = 1.0 \text{ V}.$$

This provides the desired relatively constant value for $(V_{gs19} - V_{T19})$, and for $I_L$ which is proportional to $(V_{gs19} - V_{T19})^2$.

While the preferred embodiment has been described in order to illustrate the fundamental relationships of the present invention, it should be understood that numerous variations and modifications may be made to these embodiments without departing from the teachings and concepts of the present invention. Accordingly, it should be clearly understood that the form of the present invention described above and shown in the accompanying drawings is illustrative only and is not intended to limit the scope of the invention to less than that described in the following claims.

What is claimed is:

1. A logic circuit for controlling the current $I_g$ supplied to an input node of an output circuit, said current varying between a high value $I_H$ for high speed switching of the output circuit and a lower value $I_L$ for limiting the forward biasing of the output circuit, said output circuit including an FET having a gate connected to said input node a source biased by a given reference voltage, and a drain coupled to an output terminal comprising:
   means including a depletion-mode FET for controlling said current $I_g$ supplied to said input node of said output circuit, said depletion-mode FET having a source as an output node, said output node being connected to said input node of said output circuit, said depletion-mode FET having a gate and a drain;
   means for applying a variable input logic signal to said drain of said depletion-mode FET;
   means including an enhancement-mode FET for level shifting said reference voltage to apply a constant nominal voltage to said gate of said depletion-mode FET; and
   pull-down means connected to said input node and responsive to a first level of said logic signal for discharging said output circuit and changing the voltage at said input node to a first value;
   said depletion-mode FET being biased by said input node at said first value and by said logic signal at a second level for supplying said current $I_H$;
   said voltage at said input node changing to a second value in response to said current $I_H$ to reduce the bias applied to said depletion-mode FET so that said current $I_g$ is supplied at said lower value $I_L$.

2. A logic circuit as recited in claim 1, wherein:
   said enhancement-mode FET has a gate and a drain coupled to form a second node;
   said level shifting means includes means connected to said second node for applying said nominal voltage to said second node;
   said depletion-mode FET has a gate connected to said second node; and
   said nominal voltage is variable with variations of the threshold voltage of said enhancement-mode FET.

3. A logic circuit as recited in claim 1 for controlling said current $I_g$ supplied to said output circuit in a nominal manner relatively independently of process and operating temperature variations, wherein:
   said depletion-mode FET has a nominal threshold voltage $V_{Td}$;
   said enhancement-mode FET has a nominal threshold voltage $V_{Te}$ that is subject to variation from nominal with and by substantially the same amount as said threshold voltage $V_{Td}$ during processing and as operating temperature varies; and
   said nominal voltage is shifted from said reference voltage by the actual amount of $V_{Te}$ to offset the effect of variation of $V_{Td}$ so that said current $I_g$ supplied to said output circuit is relatively independent of said process and temperature variations.

4. A logic circuit as recited in claim 3, wherein:
   said current $I_g$ supplied to said output circuit at value $I_L$ is proportional to the square of the difference between the gate-to-source voltage across said depletion-mode FET and said actual $V_{Td}$; and
   said level shifting means is effective as the operating temperature varies to vary said nominal voltage applied to said gate of said depletion-mode FET by the actual amount by which $V_{Td}$ varies so that the difference between the gate-to-source voltage across said depletion-mode FET and said actual $V_{Td}$ remains relatively constant as operating temperature varies.

5. A logic circuit, comprising:
   an output FET having a first source, a drain and an input gate;
   a depletion-mode control FET having a control gate, a drain, and a source, said source of said control FET being connected to said input gate for forming an output node;
   an enhancement-mode FET having a gate and a drain connected to the gate of said depletion-mode control field effect transistor to form therewith a second node, and a source biased to said reference voltage, so that said enhancement-mode FET biases said second node at a voltage shifted with respect to said reference voltage, so that a nominal control voltage is applied to said second node;
   said drain drain of said depletion-mode FET being adapted to receive a variable input logic signal;
   said depletion-mode FET being responsive to a transition of said logic signal from a first level to a second level for initially supplying to said output mode relatively high current for switching said output circuit;
   the voltage at said output node changing to a first value in response to said high current;
   said depletion-mode FET responding to said second level logic signal, said control voltage and said changed voltage at said output node for reducing said high current to a selected limited value;
   said output FET being forwarded biased by a selected amount in response to a given gate voltage, said given gate voltage being produced at said input gate in response to said current at said selected limited value; and
   means, connected to said output node and responsive to a transition of said logic signal to said first level, for discharging said output circuit and changing the voltage of said output node to a second value to condition said depletion-mode FET for supplying said high current.

6. A logic circuit as recited in claim 5, wherein:
   said enhancement-mode FET has a nominal threshold voltage $V_{Te}$ that is variable in response to process and operating temperature conditions;

said nominal control voltage is applied to said control gate in response to said nominal $V_{Te}$;

said depletion-mode FET has a threshold voltage $V_{Td}$ that is variable with and in substantially the same amount as $V_{Te}$ in response to process and operating temperature conditions;

said current supplied to said output node being proportional to $(V_{gs}-V_{Td})^2$, where $V_{gs}$ is the gate-to-source potential and $V_{Td}$ is said threshold voltage of said depletion-mode FET; and said biasing means shifts said reference voltage by the actual amount of said threshold voltage $V_{Te}$ such that said actual control voltage applied to said control gate is different from nominal by an amount sufficient to offset the variation from nominal of $V_{Td}$ so that $(V_{gs}-V_{Td})^2$ is relatively independent of process and operating temperature conditions.

7. A logic circuit comprising:

an input terminal to which an input logic signal, the state of which varies between first and second logic levels, is applied;

an output terminal from which an output logic signal, the state of which varies between second and first logic levels opposite to said first and second logic levels, respectively, is derived;

an output switching device having an input electrode coupled to a first voltage reference terminal, an output electrode coupled to said output terminal and a control electrode coupled to receive an output control signal for controllably causing said output switching device to provide a prescribed conductive path between its input and output electrodes;

output switching device control means, having an input electrode coupled to said input terminal, an output electrode coupled to the control electrode of said output switching device, and a control electrode, for controlling electrical characteristics of said control signal; and bias means for applying a bias voltage to the control electrode of said output switching device control means so as to cause said control signal applied to the control electrode of said output switching device to enable said output switching device to provide a conductive path between its input and output electrodes in response to the input logic signal applied to said input terminal undergoing a transition from said first logic state to said second logic state and for limiting the application of current to the control electrode of said output switching device during a steady state condition of said input logic signal, and wherein said output switching device comprises a first field effect transistor having a gate electrode corresponding to its control electrode, a source electrode corresponding to its input electrode and a drain electrode corresponding to its output electrode, and wherein said output switching device control means includes meas for causing a first, relatively large gate current to be supplied to the gate electrode of said first field effect transistor during a transition of said input logic signal from said first logic state to said second logic state and for thereafter limiting the level of gate current applied to the gate electrode of said first field effect transistor to a second, relatively low gate current during a steady state condition of said input logic signal, and wherein said output switching device control means comprises a second field effect transistor having a gate electrode corresponding to its control electrode, a source electrode corresponding to its input electrode and a drain electrode corresponding to its output electrode, and wherein said bias means comprises a third field effect transistor having a source electrode of which is coupled to said first voltage reference terminal, and gate and drain electrodes coupled in common to the gate electrode of said second field effect transistor, and wherein each of said first and third first effect transistor comprises an enhancement mode field effect transistor and said second field effect transistor comprises a depletion mode transistor.

* * * * *